(12) United States Patent
Li

(10) Patent No.: US 12,193,224 B2
(45) Date of Patent: Jan. 7, 2025

(54) MEMORY DEVICE AND METHOD FOR MANUFACTURING THE SAME

(71) Applicant: Winbond Electronics Corp., Taichung (TW)

(72) Inventor: Chun-Lin Li, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 432 days.

(21) Appl. No.: 17/591,299

(22) Filed: Feb. 2, 2022

(65) Prior Publication Data

US 2022/0246625 A1     Aug. 4, 2022

(30) Foreign Application Priority Data

Feb. 4, 2021  (TW) .................................. 110104172

(51) Int. Cl.
  *H01L 27/112*    (2006.01)
  *H10B 20/25*     (2023.01)

(52) U.S. Cl.
  CPC .................................. *H10B 20/25* (2023.02)

(58) Field of Classification Search
  CPC ......... H01L 2924/1453; H01L 23/5252; H01L 23/525–5258; G11C 17/14–165
  See application file for complete search history.

(56) References Cited

U.S. PATENT DOCUMENTS

| 2007/0120218 | A1* | 5/2007 | Hsu ..................... H01L 23/5256 257/E23.149 |
| 2010/0230781 | A1  | 9/2010 | Booth, Jr. et al. |
| 2015/0236154 | A1* | 8/2015 | Park .................... H01L 23/5252 257/331 |
| 2018/0019340 | A1* | 1/2018 | Adusumilli ........... H01L 29/785 |
| 2020/0212049 | A1* | 7/2020 | Lin ........................ H10B 12/34 |
| 2020/0343182 | A1* | 10/2020 | Lin ....................... H10B 12/50 |

FOREIGN PATENT DOCUMENTS

CN     110875322 A     3/2020

* cited by examiner

*Primary Examiner* — Shahed Ahmed
*Assistant Examiner* — Rhys Poniente Sheker
(74) *Attorney, Agent, or Firm* — MUNCY, GEISSLER, OLDS & LOWE, P.C.

(57) ABSTRACT

A memory device includes a substrate and an eFuse structure. The substrate includes an array region and an eFuse region and the eFuse region of the substrate has an eFuse trench. The eFuse structure includes a first gate oxide layer, a plurality of doped regions, a dummy buried word line, and an eFuse gate electrode. The first gate oxide layer is conformally formed on a surface of the eFuse trench. The doped regions are respectively formed in the substrate on opposite sides outside the eFuse trench, and in contact with the first gate oxide layer. The dummy buried word line is formed on the first gate oxide layer. The eFuse gate electrode is formed on the dummy buried word line and in contact with the first gate oxide layer. The dummy buried word line is electrically isolated from the eFuse gate electrode.

16 Claims, 11 Drawing Sheets

MEMORY DEVICE AND METHOD FOR MANUFACTURING THE SAME

CROSS REFERENCE TO RELATED APPLICATION

This application claims priority of Taiwan Patent Application No. 110104172, filed on Feb. 4, 2021, the entirety of which is incorporated by reference herein.

BACKGROUND

Field of the Disclosure

The present disclosure is related to a memory device and a method for manufacturing the same, and in particular, it is related to the memory device having an electronic fuse (eFuse) structure and a method for manufacturing the same.

Description of the Related Art

With the trend toward miniaturization of electronic products, there is also demand for smaller memory devices. However, with the miniaturization of memory devices, it becomes more difficult to improve the reliability and yield of such devices.

For example, in a conventional dynamic random access memory (DRAM), an eFuse is usually formed between the array region and the peripheral region. An electronic fuse generally includes two conductive structures and a dielectric layer (for example, a gate oxide layer) between the two conductive structures. When the operation of writing is performed, a high voltage is applied to the two conductive structures to breakdown the dielectric layer, thereby forming a permanent conductive path in the dielectric layer. As the location of the dielectric breakdown changes, the current value that can be read from the eFuse structure also changes. As the length of the conductive path that connects the two conductive structures and the position where the dielectric breakdown occurs is reduced, the resistance of the eFuse structure can be reduced, and the narrower distribution of the resistance can be obtained. As a result, it will improve the yield and reliability of the memory device. However, in the current structure of the memory device, the location where the dielectric breakdown in the eFuse randomly occurs and is difficult to be controlled. Therefore, it is not conducive for improving the yield and reliability of the memory device.

SUMMARY

Embodiments of the present invention provide a memory device and a method for manufacturing the same, which can improve the resistance value and resistance value distribution of an eFuse structure of the memory device. Therefore, the performance and yield of the memory device can be improved.

In some embodiments of the disclosure, a memory device is provided. The memory device includes a substrate having an array region and an electronic fuse (eFuse) region, wherein the eFuse region of the substrate has an eFuse trench. The memory device further includes an eFuse structure. The eFuse structure includes a first gate oxide layer conformally formed on the surface of the eFuse trench; several doped regions respectively formed in the substrate on opposite sides outside the eFuse trench, wherein the doped regions are in contact with the first gate oxide layer; a dummy buried word line formed on the first gate oxide layer; and an eFuse gate electrode formed on the dummy buried word line and in contact with the first gate oxide layer, wherein the dummy buried word line is electrically isolated from the eFuse gate electrode.

In some embodiments of the disclosure, a method for manufacturing a memory device is provided. The method includes providing a substrate, wherein the substrate has an array region and an eFuse region; and forming an eFuse structure in the eFuse region of the substrate. Formation of the eFuse structure includes forming an eFuse trench in the eFuse region of the substrate; forming a first gate oxide layer on the surface of the eFuse trench; forming a dummy buried word line on the first gate oxide layer; forming a plurality of doped regions respectively in the substrate on opposite sides outside the eFuse trench, wherein the doped regions are in contact with the first gate oxide layer; and forming an eFuse gate electrode on the dummy buried word line and in contact with the first gate oxide layer, wherein the dummy buried word line is electrically isolated from the eFuse gate electrode.

The memory device in accordance with some embodiments of the present invention provides an eFuse gate electrode above the dummy buried word line and the insulating filling layer, and the position where the dielectric breakdown occurs in the gate oxide layer can be controlled within a certain range. Therefore, the resistance values and its distribution of the eFuse structure can be improved. Accordingly, the performance and the yield of the memory device can be improved. In addition, according to the method for manufacturing the memory device in some embodiments of the present invention, the first few processes for forming the e-fuse structure in the eFuse region can be integrated with the processes for forming the structure in the array region. Also, the later processes for forming the e-fuse structure in the eFuse region can be integrated with the processes for forming the structures in the array region and the peripheral region. Therefore, the production cost and the process complexity of the manufacturing method that is provided in some embodiments of the present disclosure can be reduced.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. Throughout the various views and illustrative embodiments, similar reference numbers are used to designate similar features/components for the sake of simplicity and clarity.

Furthermore, when a number or a range of numbers is described with "about," "approximate," and the like, the term is intended to encompass numbers that are within 20% of a given number or range, preferably within 10% of a given number or range, and more preferably within 5% of a given number or range. The number given here is an approximate number, which means that the meaning of "about" and "approximately" can still be implied in the absence of specific indications.

FIG. 1A-FIG. 1F are cross-sectional views of various manufacturing stages of an array region 10 and an eFuse region 20 of a memory device in accordance with some embodiments of the present disclosure. It should be noted that the "eFuse structure" described in the embodiments can be referred to an eFuse structure in which two conductive structures are electrically insulated from each other by applying a voltage. It can also be referred to an anti-fuse structure in which two conductive structures are electrically connected to each other by applying a voltage.

Figure 1A:
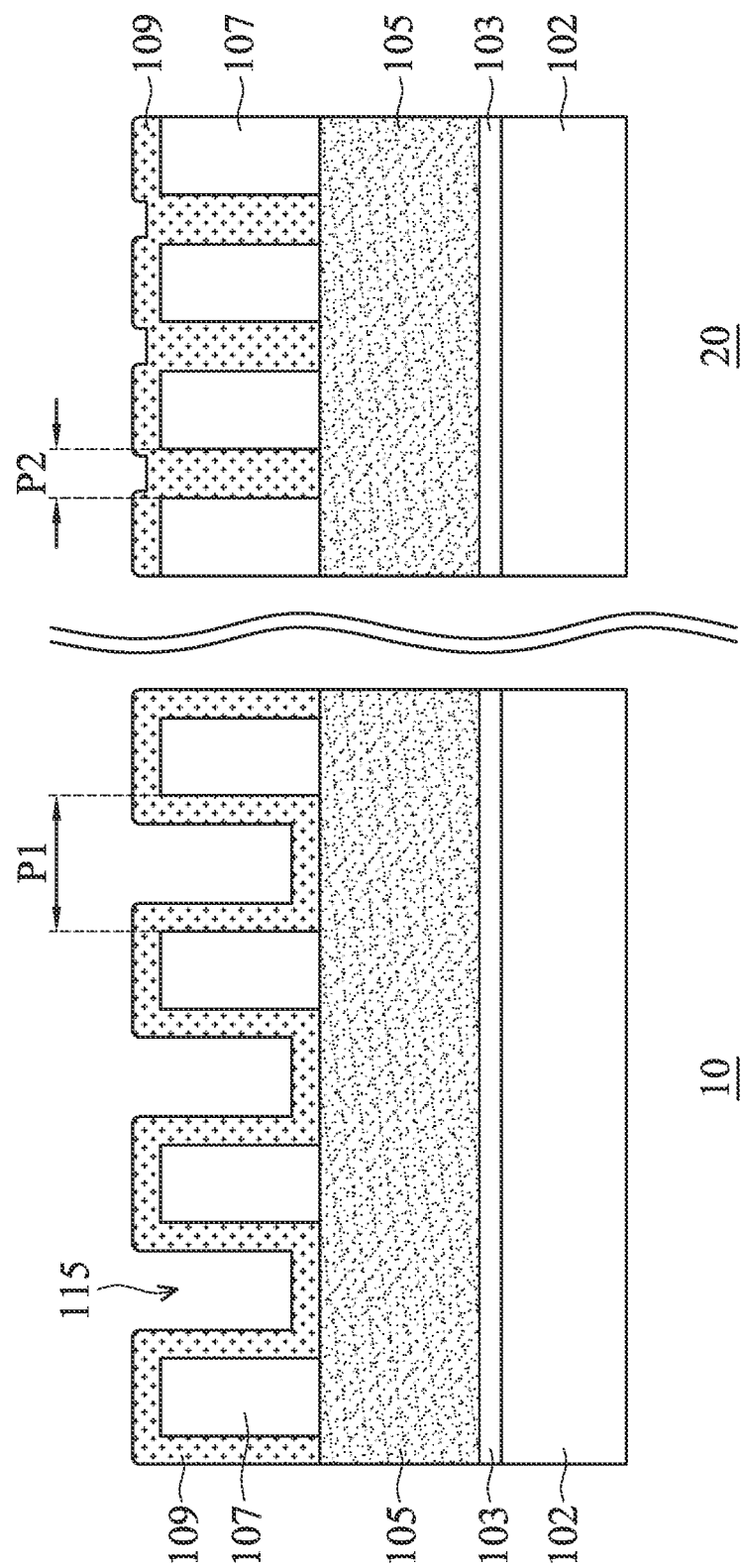
FIG. 1A-FIG. 1F are cross-sectional views of various manufacturing stages of an array region and an electronic Fuse (abbreviated "eFuse") region of a memory device in accordance with some embodiments of the present disclosure.

Referring to FIG. 1A, a first insulating layer 103 and a hard mask layer 105 is formed on a substrate 102. Next, mask patterns 107 are formed on the hard mask layer 105. A first sacrificial layer 109 is then conformally formed on the mask patterns 107.

Material examples of the substrate 102 may include silicon, a silicon-containing semiconductor, silicon on insulator (SOI), another suitable substrate material, or a combination thereof. In this embodiment, the substrate 102 is a silicon substrate. In some embodiments, a shallow trench isolation structure is formed in the substrate 102. In some embodiments, other components can also be formed in the substrate 102. For example, p-type well regions, n-type well regions, or conductive regions can be formed in the substrate 102 by an implantation process. The above-mentioned shallow trench isolation structure and other components are not depicted in the drawings for the sake of simplicity and clarity. Also, the components in the substrate 102 and the formation methods thereof will not be described in detail here. The first insulating layer 103 may include oxide, nitride, oxynitride, carbide, another suitable insulating material, or a combination thereof. In this embodiment, the first insulating layer 103 includes silicon oxide that is formed by thermal oxidation.

Material examples of the hard mask layer 105 may include polysilicon, oxide, nitride, oxynitride, a carbon-based material (for example, a diamond-like carbon film), another suitable insulating material, or a combination thereof. In this embodiment, the hard mask layer 105 is a diamond-like carbon film. Material examples of the mask patterns 107 may include polysilicon, oxide, nitride, oxynitride, a carbon-based material (for example, a diamond-like carbon film), photoresist, another suitable mask material, or a combination thereof. In order to achieve etching selectivity in the subsequent etching process, the material of the hard mask layer 105 may be different from the material of the mask patterns 107. In this embodiment, the mask patterns 107 include silicon oxycarbide. The hard mask layer 105 and the mask patterns 107 can each independently be a single-layer structure formed of a single material or a multi-layer structure formed of different materials.

The first sacrificial layer 109 may include silicon oxide, silicon nitride, oxynitride, or a combination thereof. In this embodiment, the first sacrificial layer 109 is a silicon oxide layer, and can be formed by a suitable deposition process, such as a chemical vapor deposition (CVD) process, an atomic layer deposition (ALD) process, or a combination thereof.

Still referring to FIG. 1A, adjacent mask patterns 107 in the array region 10 have a first interval P1, and adjacent mask patterns 107 in the e-fuse region 20 have a second interval P2. The second interval P2 is smaller than the first interval P1. Therefore, when the spaces between the mask patterns 107 in the eFuse region 20 are filled up with the first sacrificial layer 109, the spaces between the mask patterns 107 in the array region 10 have not yet been filled. That is, the top surface of the first sacrificial layer 109 constitutes several first trenches 115 in the array region 10, and each of the first trenches 115 is formed between adjacent mask patterns 107.

Figure 1B:
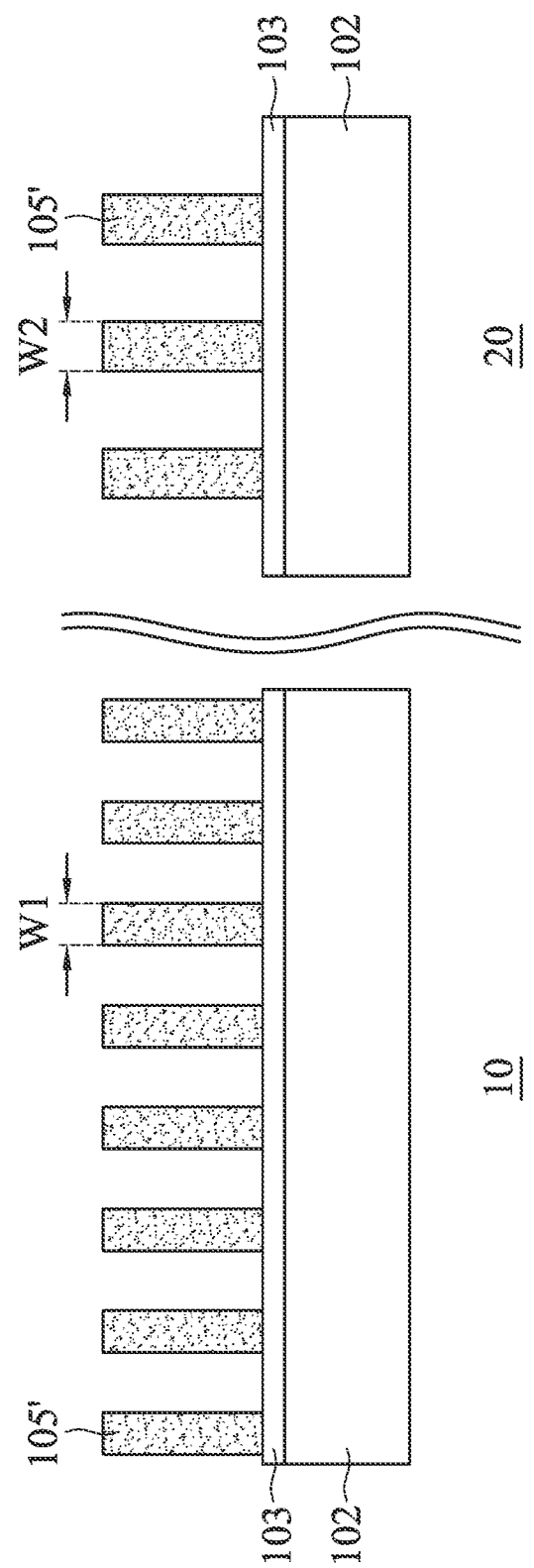

Referring to FIG. 1B, several etching processes can be performed for patterning the hard mask layer 105, so as to form hard mask patterns 105' on the first insulating layer 103. More specifically, a first etching process is performed to partially remove the first sacrificial layer 109, so that the top surfaces of the mask patterns 107 are exposed. The remaining portions of the first sacrificial layer 109 are formed on the side walls of the mask patterns 107 in the array region 10 and can be referred to as spacers. In addition, after the first etching process, the top surface of the hard mask layer 105 at the bottom of the first trench 115 is exposed in the array region 10. Also, after the first etching process, the top surface of the hard mask layer 105 between the mask patterns 107 in the eFuse region 20 are not exposed and still covered by the first sacrificial layer 109. Then, a second etching process is performed to remove the mask patterns 107 but retain the first sacrificial layer 109. Next, a third etching process is performed on the hard mask layer 105 by using the first sacrificial layer 109 as an etching mask, thereby transferring the pattern of the first sacrificial layer 109 to the hard mask layer 105. After the third etching process is performed, each of the hard mask patterns 105' in the array region 10 has a first width W1, and each of the hard mask patterns 105' in the eFuse region 20 has a second width W2. The second width W2 is greater than the first width W1.

The first etching process, the second etching process and the third etching process may each independently include an anisotropic etching process. In order to form a pattern of the first sacrificial layer 109 that will be transferred to the hard mask layer 105, the first etching process is chosen that an etching rate for the first sacrificial layer 109 is much greater than an etching rate for the mask patterns 107, and is much greater than an etching rate for the hard mask layer 105. Also, the second etching process is chosen that an etching rate for the mask patterns 107 is much greater than an etching rate for the first sacrificial layer 109.

Figure 1C:
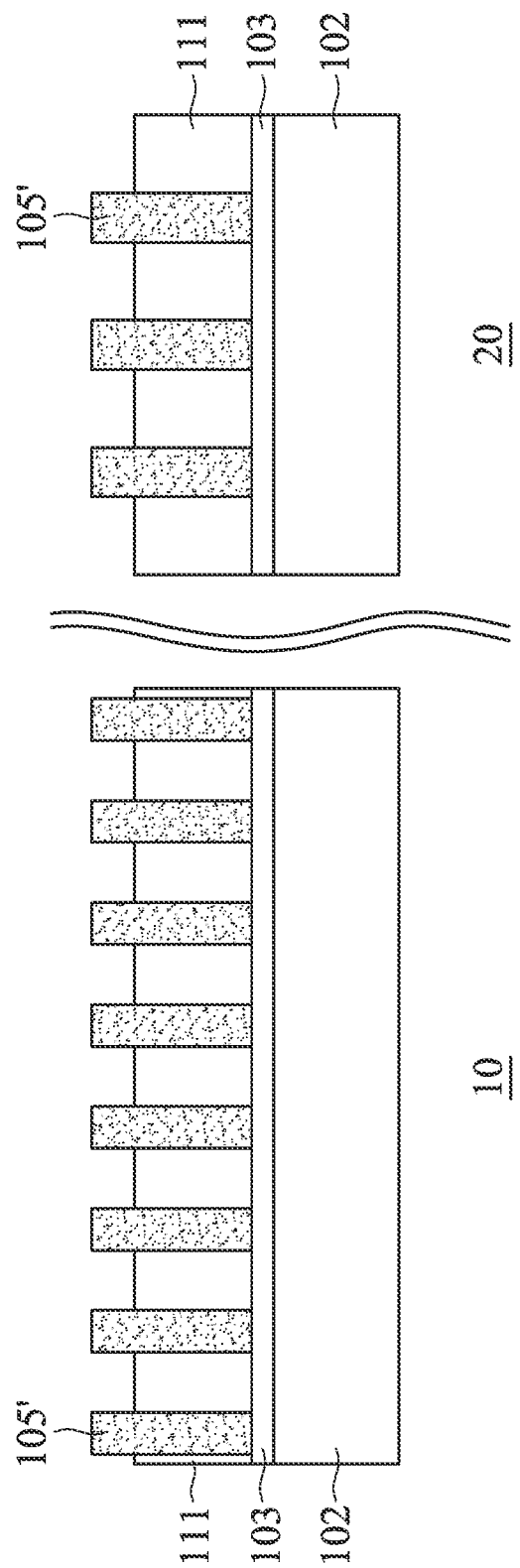

Referring to FIG. 1C, a second sacrificial layer 111 is formed over the hard mask patterns 105'. The second sacrificial layer 111 covers the hard mask patterns 105' and fully fills the spaces between the hard mask patterns 105'. Then, the second sacrificial layer 111 is etched back to expose the top surfaces of the hard mask patterns 105'. The material and forming method of the second sacrificial layer 111 may be the same as or similar to the material and forming method of the first sacrificial layer 109. In this embodiment, the second sacrificial layer 111 is a silicon oxide layer, and can be formed by CVD process.

Figure 1D:
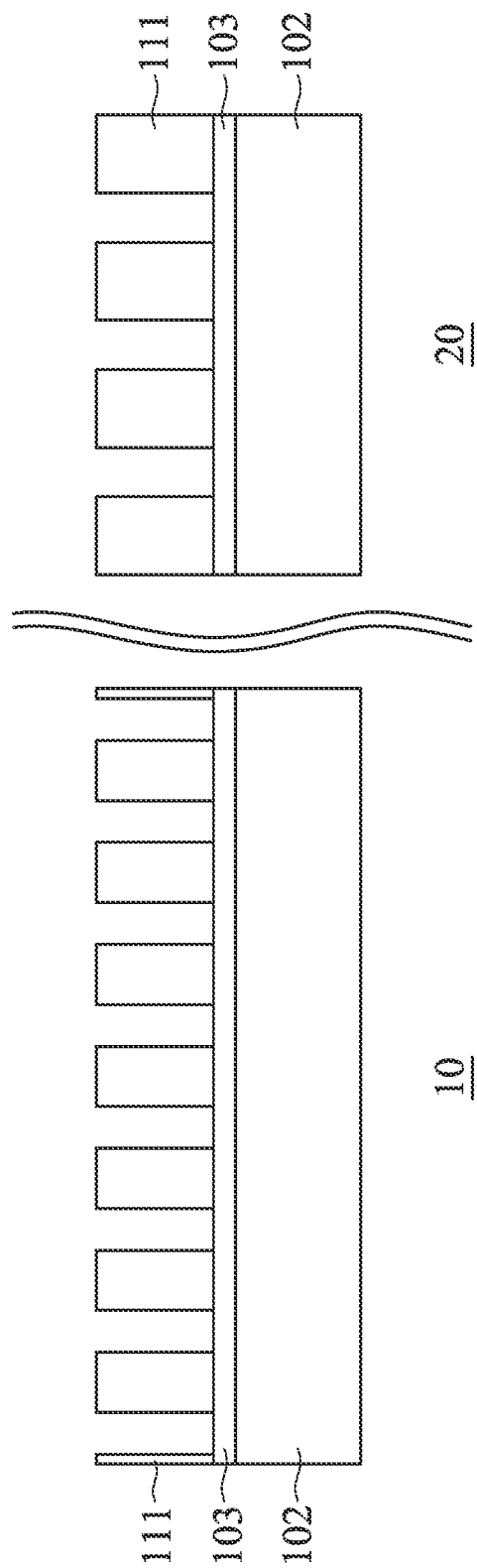

Referring to FIG. 1D, a fourth etching process is performed to remove the hard mask patterns 105'. After the fourth etching process is performed, the second sacrificial layer 111 remains on the first insulating layer 103. The fourth etching process may include an anisotropic etching process.

In order to selectively remove the hard mask patterns 105', the fourth etching process is chosen that an etching rate for the hard mask patterns 105' is much greater than an etching rate for the second sacrificial layer 111.

Figure 1E:
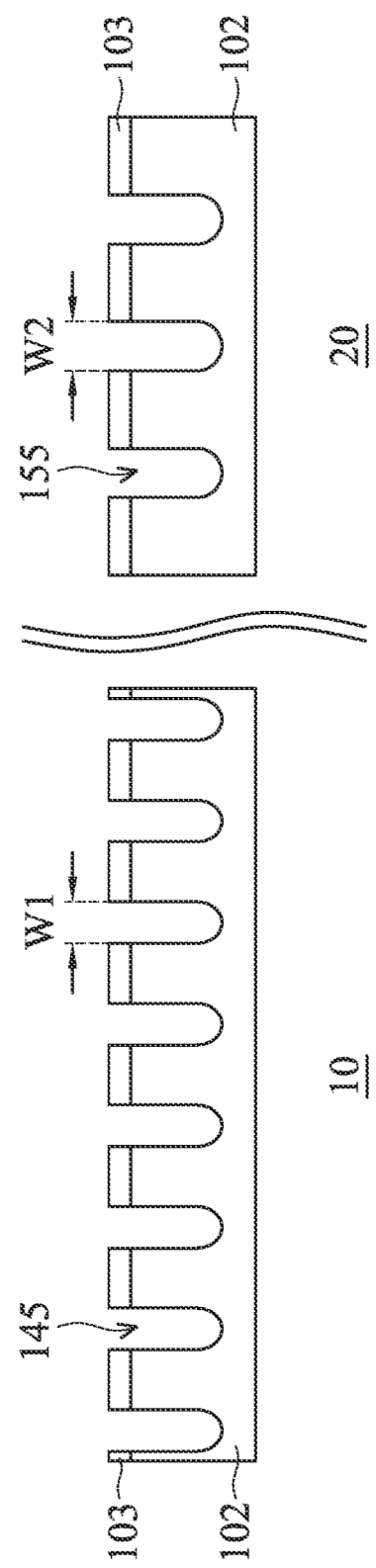
Figure 1F:
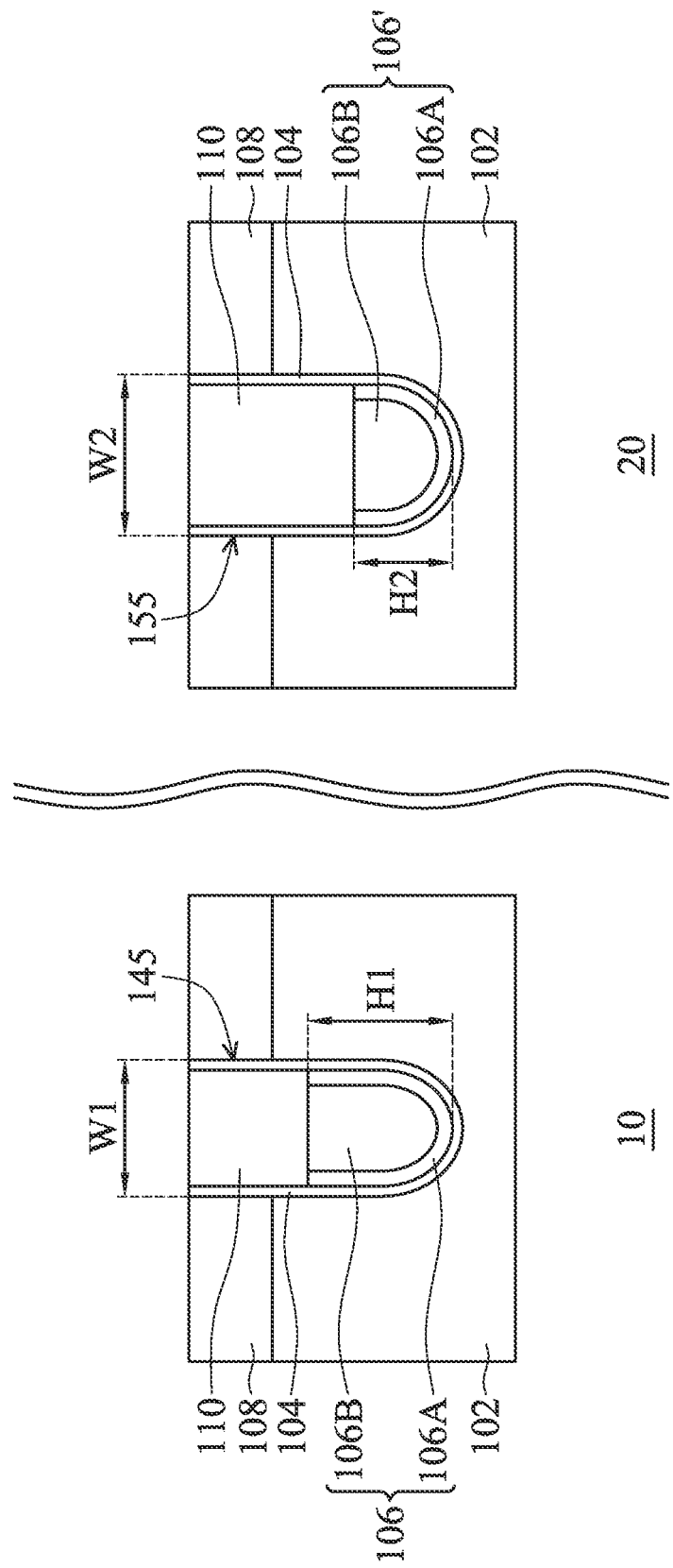

Referring to FIG. 1E, a fifth etching process is performed on the substrate 102 and the first insulating layer 103 by using the second sacrificial layer 111 as an etching mask, thereby forming several second trenches 145 in the array region 10 and several third trenches 155 in the eFuse region 20. The second trenches 145 in the array region 10 and the third trenches 155 in the eFuse region 20 are formed in the substrate 102. Each of the second trenches 145 has the first width W1, and each of the third trenches 155 has the second width W2. The fifth etching process may include an anisotropic etching process. In the subsequent process, a buried word line 106 (as shown in FIG. 1F) will be formed in the respective second trench 145. Therefore, in this embodiment, the second trenches 145 can be referred to as "word line trenches 145". In addition, an eFuse structure (as shown in FIG. 2G) will be formed in the respective third trench 155. Therefore, in this embodiment, the third trenches 155 can be referred to as "eFuse trenches 155".

FIG. 1F merely illustrates one word line trench 145 in the array region 10 and one third trench 155 in the eFuse region 20 for the sake of simplicity and clarity. Referring to FIG. 1F, a gate oxide layer 104 is conformally formed on the substrate 102, such that the gate oxide layer 104 is formed on the surfaces of the word line trenches 145 and the surfaces of the eFuse trenches 155. In this embodiment, the gate oxide layer 104 includes silicon oxide that is formed by thermal oxidation. Next, a first conductive layer 106A is conformally formed on the gate oxide layer 104. A second conductive layer 106B is then filled in the word line trench 145 and the eFuse trench 155 where the first conductive layer 106A has been formed. The top surface of the first conductive layer 106A and the top surface of the second conductive layer 106B are lower than the top surface of the substrate 102.

The first conductive layer 106A may include titanium, titanium nitride, tungsten nitride, tantalum, tantalum nitride, another suitable insulating material, or a combination thereof. The second conductive layer 106B may include tungsten, aluminum, copper, gold, silver, an alloy thereof, another suitable metal material, or a combination thereof. The first conductive layer 106A and the second conductive layer 106B may each independently be formed by CVD process, physical vapor deposition (PVD) process, ALD process, another suitable deposition process, or a combination thereof. In this embodiment, the first conductive layer 106A includes titanium nitride, and the second conductive layer 106B includes tungsten. In some embodiments, the first conductive layer 106A and the second conductive layer 106B in the word line trench 145 can be collectively referred to as a "buried word line 106". Also, the first conductive layer 106A and the second conductive layer 106B in the eFuse trench 155 can be collectively referred to as a "dummy buried word line 106'". The dummy buried word line 106' does not electrically connect other components.

Referring to FIG. 1F, the width (i.e., the second width W2) of the eFuse trench 155 is greater than the width (i.e., the first width W1) of the word line trench 145. Therefore, after the word line trench 145 is fully filled with the second conductive layer 106B, the top surface of the second conductive layer 106B in the word line trench 145 will be higher than the top surface of the second conductive layer 106B in the eFuse trench 155. Next, the first conductive layer 106A and the second conductive layer 106B are partially removed (such as being etched back), so that the buried word line 106 formed in the word line trench 145 has the first thickness H1, and the dummy buried word line 106' formed in the eFuse trench 155 has the second thickness H2. The second thickness H2 is less than the first thickness H1. In other words, the top surface of the buried word line 106 is higher than the top surface of the dummy buried word line 106'.

Still referring to FIG. 1F, an insulating material is filled in the word line trench 145 and the e-fuse trench 155, wherein the buried word line 106 has been formed in the word line trench 145 and the dummy buried word line 106' has been formed in the e-fuse trench 155. Then, the excess insulating material is removed by a planarization process (for example, a chemical mechanical polishing process) to form an insulating filling layer 110 on the buried word line 106 and the dummy buried word line 106'. In this embodiment, this planarization process also removes the portion of the gate oxide layer 104 above the top surface of the substrate 102, thereby exposing the top surface of the substrate 102. The insulating filling layer 110 may include silicon oxide, silicon nitride, oxynitride, another suitable insulating material, or a combination thereof. In this embodiment, the insulating filling layer 110 includes silicon nitride.

Next, an implantation process is performed on the substrate 102 to form the doped regions 108 in the substrate 102. As shown in FIG. 1F, the doped regions 108 are formed on opposite sides outside the word line trench 145 and formed on the opposite sides outside the e-fuse trench 155 in accordance with some embodiments. In this embodiment, the doped regions 108 can also be referred to as the "source/drain structures 108" for the sake of simplicity and clarity.

Figure 2A:
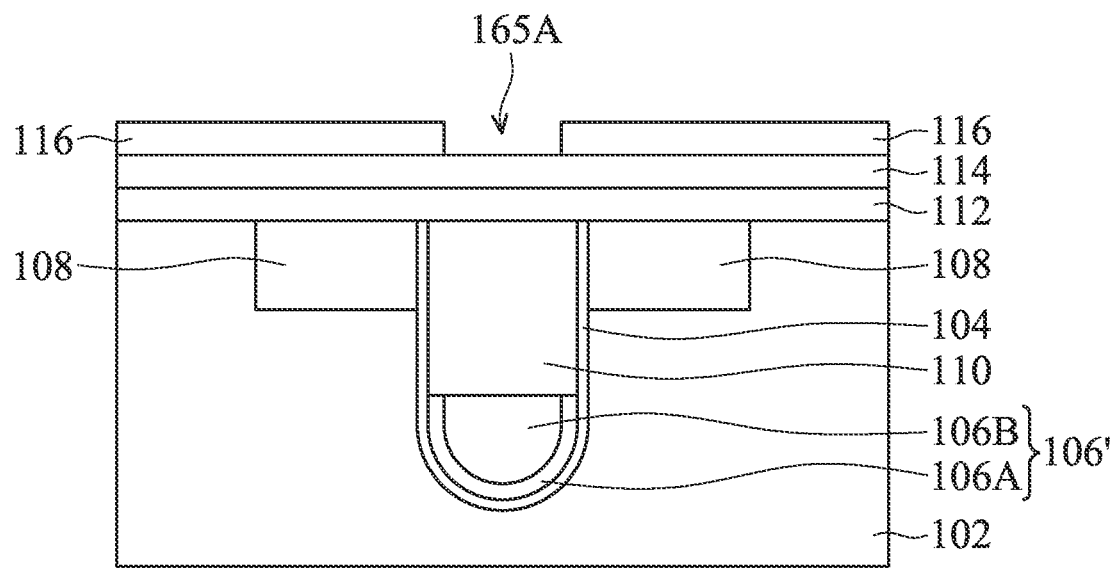
FIG. 2A-FIG. 2G are cross-sectional views of various stages of manufacturing an eFuse structure 100 in accordance with some embodiments of the present disclosure.
Figure 2B:
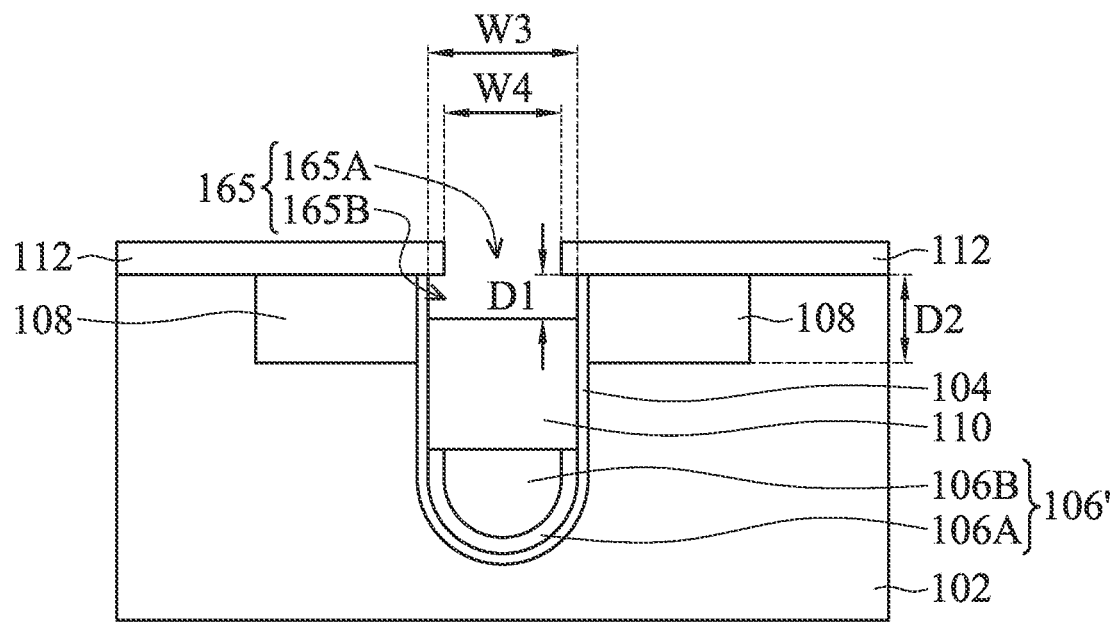
Figure 2C:
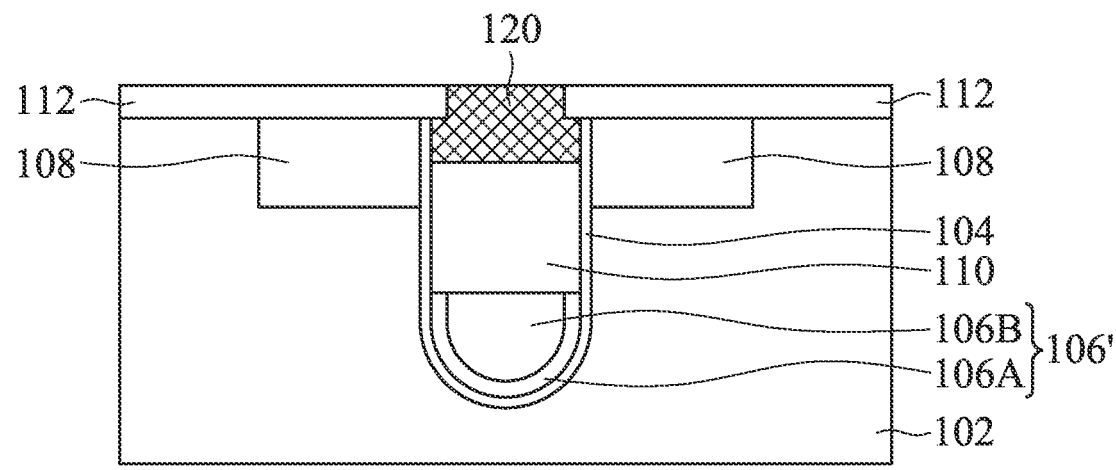
Figure 2D:
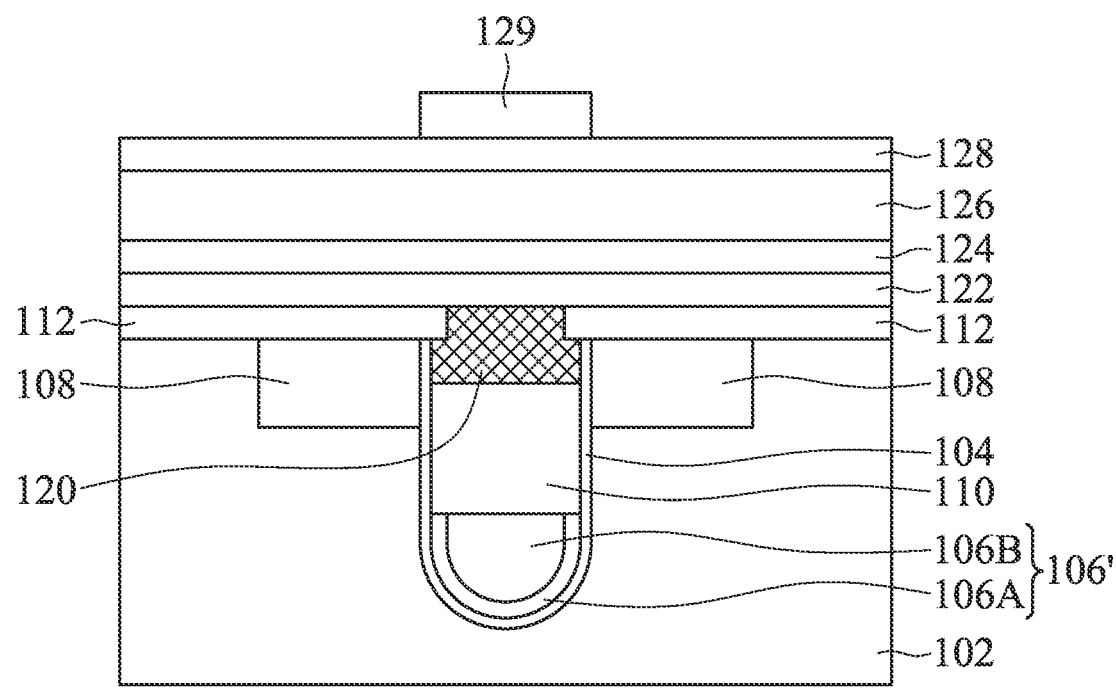
Figure 2E:
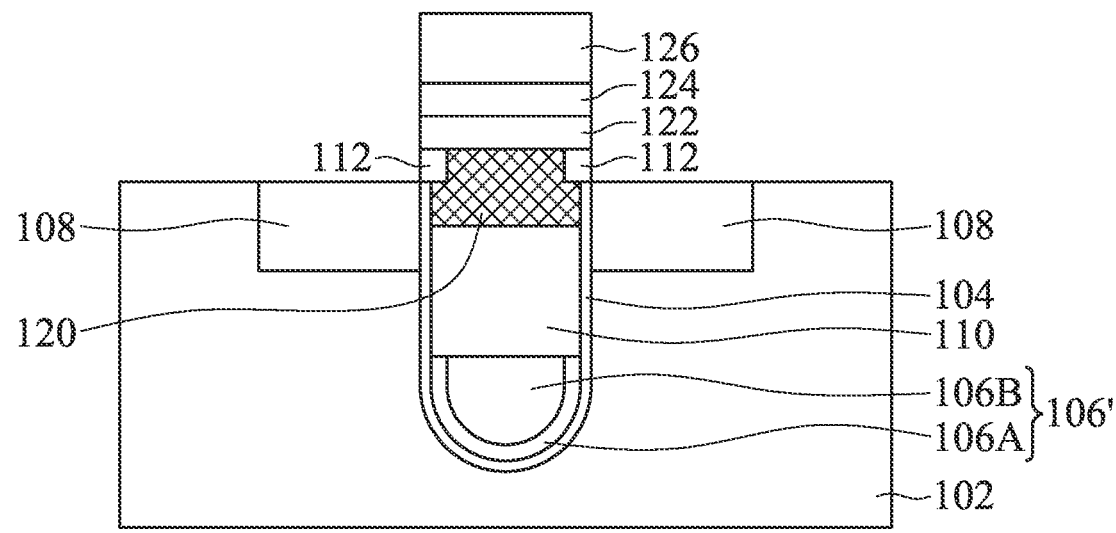
Figure 2F:
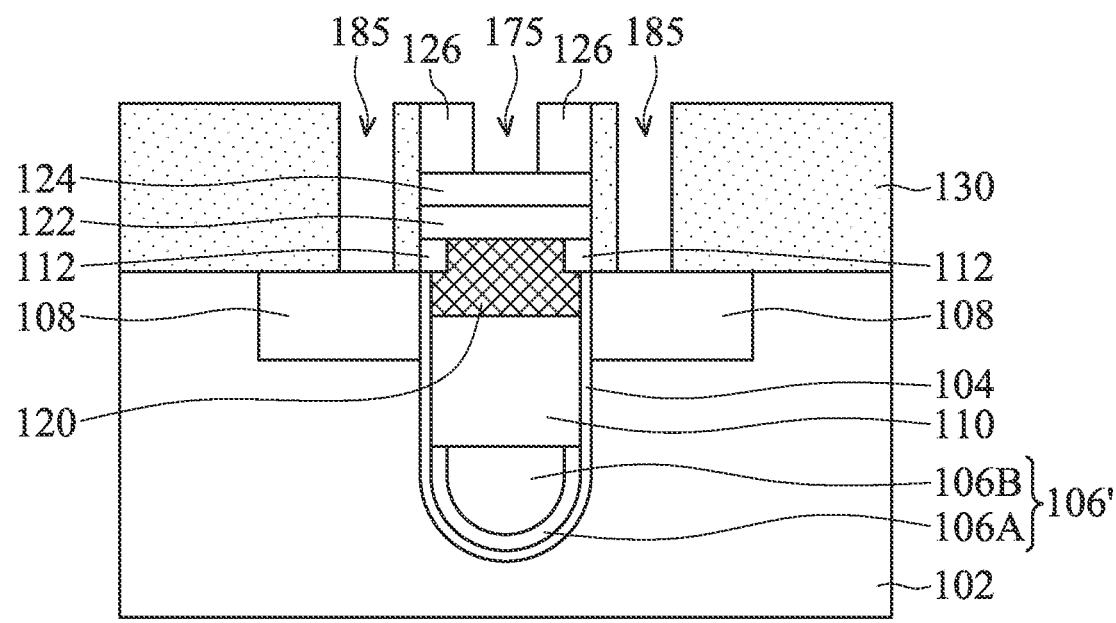
Figure 2G:
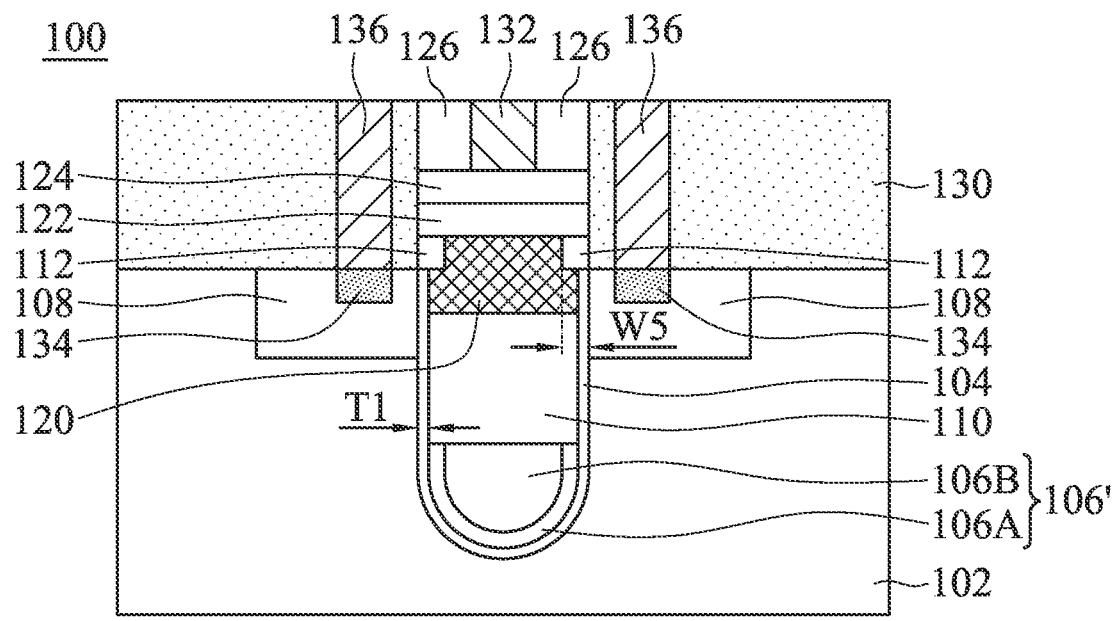

FIG. 2A-FIG. 2G are cross-sectional views of various stages of manufacturing an eFuse structure 100 in accordance with some embodiments of the present disclosure. Also, FIG. 2A-FIG. 2G merely illustrate one eFuse structure 100 in the eFuse region 20 for the sake of simplicity and clarity. Referring to FIG. 2A, after the structure shown in FIG. 1F is formed, a gate oxide layer 112, a hard mask layer 114 and a patterned photoresist layer 116 are sequentially formed on the substrate 102. The patterned photoresist layer 116 has an opening 165A. The position of the opening 165A corresponds to the position of the eFuse trench 155. The material and forming method of the gate oxide layer 112 can be the same as or similar to the material and forming method of the gate oxide layer 104. The material and forming method of the hard mask layer 114 may be the same as or similar to the material and forming method of the hard mask layer 105. The patterned photoresist layer 116 may include a known photoresist material.

Referring to FIG. 2B, a sixth etching process is performed on the hard mask layer 105 and the gate oxide layer 112 by using the patterned photoresist layer 116 as an etching mask, thereby transferring the pattern of the opening 165A to the gate oxide layer 112. The sixth etching process may include an anisotropic etching process. Next, a seventh etching process is performed on the insulating filling layer 110. The insulating filling layer 110 is partially removed to form a receiving space 165 for eFuse gate electrode. As shown in FIG. 2B, the receiving space 165 for eFuse gate electrode is positioned on the insulating filling layer 110 that a portion with the first thickness D1 has been removed. Also, the receiving space 165 for eFuse gate electrode includes the opening 165A and a receiving space 165B (having the first thickness D1) in communication with the opening 165A. The seventh etching process may include an isotropic etching process or an anisotropic etching process. The seventh etching process is chosen that an etching rate for the insulating filling layer 110 is much greater than an etching rate for the first insulating layer 103, and is also much greater than an etching rate for the gate oxide layer 112. Accordingly, after the insulating filling layer 110 is partially removed, the gate oxide layer 104 and the gate oxide layer 112 still remain in the eFuse trench 155 and over the substrate 102, respectively.

Referring to FIG. 2C, the receiving space 165 for eFuse gate electrode is filled with a conductive material. Next, the excess conductive material is removed by a planarization process to form an eFuse gate electrode 120 in the receiving space 165. The eFuse gate electrode 120 is formed on the insulating filling layer 110. The eFuse gate electrode 120 is in contact with the gate oxide layer 104 and the gate oxide layer 112. Material examples of the eFuse gate electrode 120 may include doped polysilicon, another suitable conductive material, or a combination thereof. In this embodiment, the eFuse gate electrode 120 includes doped polysilicon.

In this embodiment, the top surface of the eFuse gate electrode 120 can be level with the top surface of the gate oxide layer 112. Also, the top surface of the eFuse gate electrode 120 can be higher than the top surfaces of the doped regions 108. In this way, it is advantageous to form a flat metal silicide layer 122 in the subsequent process. In some other embodiments, an etching back process (by, for example, dry etching or wet etching) can be performed to remove excess conductive material. Therefore, the top surface of the eFuse gate electrode 120 can be lower than the top surface of the gate oxide layer 112. In one example, the top surface of the eFuse gate electrode 120 can be level with the top surfaces of the doped regions 108. In this way, the operating voltage of the eFuse structure 100 can be reduced.

Referring to FIG. 2D, a metal silicide layer 122, a metal layer 124, a capping layer 126, a hard mask layer 128 and a patterned photoresist layer 129 are sequentially formed on the gate oxide layer 112 and the eFuse gate electrode 120. The position of the patterned photoresist layer 129 corresponds to the position of the eFuse gate electrode 120. The metal silicide layer 122 may include silicide of a metal (such as cobalt, tungsten, nickel, or a combination thereof). The metal layer 124 may include cobalt, tungsten, nickel, another suitable metal, or a combination thereof. The capping layer 126 may include oxide, nitride, oxynitride, another suitable insulating material, or a combination thereof. In this embodiment, the capping layer 126 includes silicon nitride. The metal silicide layer 122, the metal layer 124 and the capping layer 126 may each independently be formed by CVD process, PVD process, ALD process, another suitable deposition process, or a combination thereof. The material and forming method of the hard mask layer 128 may be the same as or similar to the material and forming method of the hard mask layer 105. The patterned photoresist layer 129 may include a known photoresist material.

Referring to FIG. 2E, an eighth etching process is performed by using the patterned photoresist layer 129 as an etching mask to pattern the gate oxide layer 112, the metal silicide layer 122, the metal layer 124 and the capping layer 126, and remove the hard mask layer 128. The eighth etching process may include an anisotropic etching process. After the eighth etching process is performed, the remaining portions of the gate oxide layer 112, the metal silicide layer 122, the metal layer 124 and the capping layer 126 are formed above the eFuse trench. The position of the remaining portions of the gate oxide layer 112, the metal silicide layer 122, the metal layer 124 and the capping layer 126 corresponds to the position of the eFuse trench. Also, after the eighth etching process is performed, the top surface of the substrate 102 and the top surfaces of the source/drain structures 108 are exposed.

Referring to FIG. 2F, a second insulating layer 130 is formed on the substrate 102. The top surface of the second insulating layer 130 is level with the top surface of the capping layer 126. The second insulating layer 130 may include oxide, nitride, oxynitride, carbide, another suitable insulating material, or a combination thereof. In this embodiment, the second insulating layer 130 is an SOG (spin on glass) insulating layer. Next, a ninth etching process is performed to form an opening 175 in the capping layer 126 and the source/drain contact holes 185 in the second insulating layer 130. The opening 175 exposes the metal layer 124, and the source/drain contact holes 185 expose the source/drain structures 108. The ninth etching process may include an anisotropic etching process. In order to ensure the metal layer 124 and/or the source/drain structures 108 can be exposed, the ninth etching process is an over-etching process, in accordance with some embodiments of the present disclosure.

Referring to FIG. 2G, the opening 175 and the source/drain contact holes 185 are filled with a conductive material. Then, the excess conductive material is removed by a planarization process to form a conductive layer 132 in the opening 175 and the source/drain contact structures 136 in the source/drain contact holes 185, thereby forming an eFuse structure 100. In this embodiment, after the source/drain contact holes 185 are filled with the conductive material, a heating process can be performed to form a metal silicide layer 134 between the source/drain contact structure 136 and the source/drain structure 108. The materials of the conductive layer 132 and the source/drain contact structures 136 may be the same as or similar to the material of the metal layer 124. The material of the metal silicide layer 134 may be the same as or similar to the material of the metal silicide layer 122. The eFuse gate electrode 120 can be electrically connected to an external component via the metal silicide layer 122, the metal layer 124 and the conductive layer 132. Therefore, the metal silicide layer 122, the metal layer 124 and the conductive layer 132 can be collectively referred to as "an eFuse contact structure", in accordance with some embodiments.

The width of the conductive layer 132 may be less than or equal to the width of the metal layer 124. In this embodiment, the width of the conductive layer 132 is less than the width of the metal layer 124. Therefore, the risk of a short circuit between the metal layer 124 and the source/drain contact structures 136 can be reduced, thereby improving the yield of the memory device. In some other embodiments, the width of the conductive layer 132 is equal to the width of the metal layer 124; thus, the resistance of the e-fuse contact structure can be reduced, thereby improving the performance of the memory device.

After the manufacturing processes for forming the structure shown in FIG. 2G are completed, other known manufacturing processes can be subsequently performed to complete the memory device. For the sake of simplicity and clarity, other known manufacturing processes will not be described in detail here.

Figure 3:
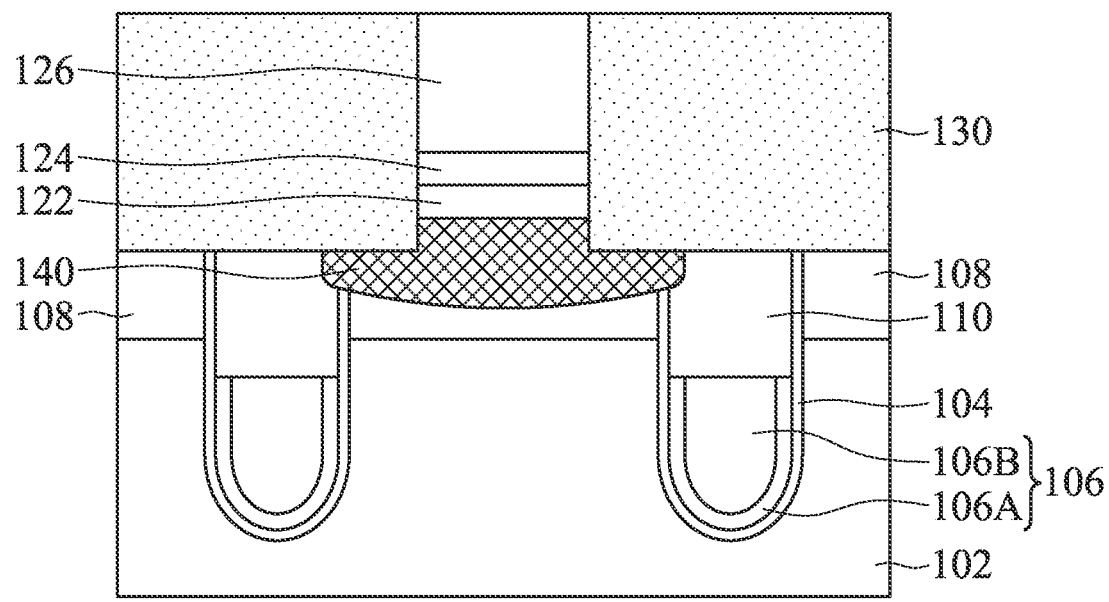
FIG. 3 is a cross-sectional view of a structure in an array region in accordance with some embodiments of the present disclosure.
Figure 4:
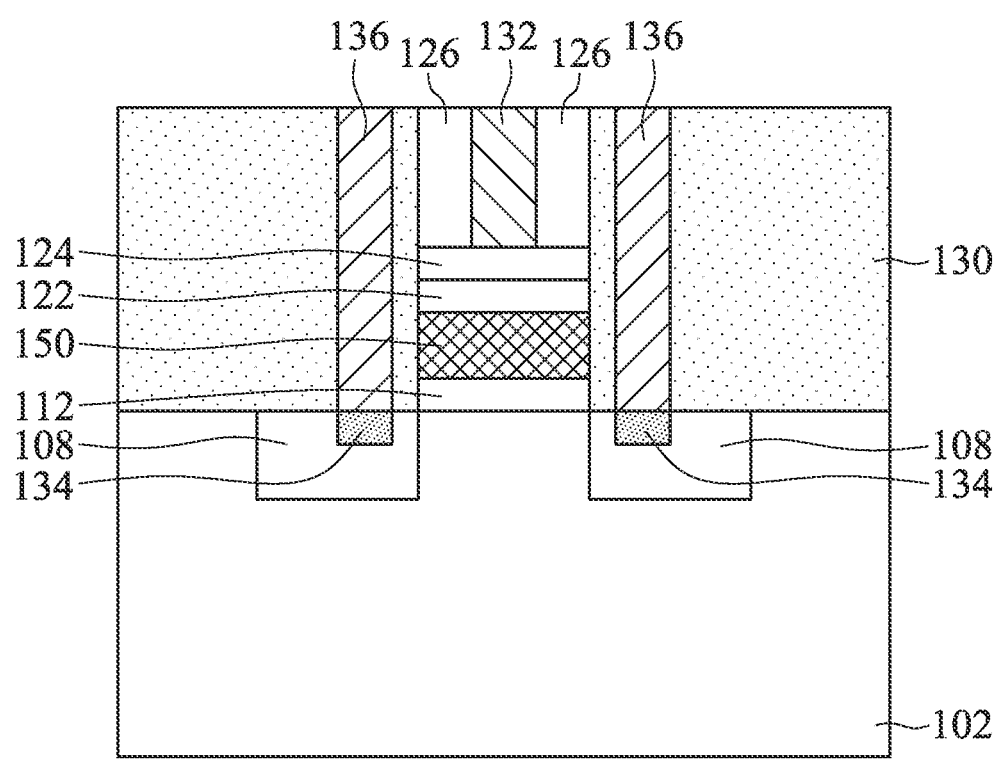
FIG. 4 is a cross-sectional view of a structure in a peripheral region in accordance with some embodiments of the present disclosure.

FIG. 3 is a cross-sectional view of a structure in an array region 10, in accordance with some embodiments of the present disclosure. FIG. 4 is a cross-sectional view of a structure in a peripheral region 30, in accordance with some embodiments of the present disclosure. In some embodiments, the peripheral region 30 surrounds the array region 10, and the eFuse region 20 is positioned at a junction of the array region 10 and the peripheral region 30. In some other embodiments, the array region 10, the eFuse region 20 and the peripheral region 30 can be arranged in any adequate placement according to design requirements. According to some embodiments of the present disclosure, after the manufacturing processes for forming the structure shown in FIG. 2G are completed, the cross-sectional views of the structures in the array region 10, the eFuse region 20 and the peripheral region 30 are shown in FIG. 3. FIG. 2G and FIG. 4, respectively.

According to the method for manufacturing the memory device in some embodiments, the first few processes for forming the e-fuse structure in the eFuse region 20 can be integrated with the processes for forming the structure in the array region 10. Also, the later processes for forming the e-fuse structure in the eFuse region 20 can be integrated with the processes for forming the structure in the array region 10 and the structure in the peripheral region 30. Therefore, the production cost and the process complexity of the manufacturing method can be reduced.

More specifically, referring to FIG. 1A to FIG. 1F, the word line trench 145 in the array region 10 and the e-fuse trench 155 in the e-fuse region 20 are formed simultaneously in the same manufacturing process. Also, the buried word line 106 formed in the array region 10 and the dummy buried word line 106' formed in the eFuse region 20 are formed simultaneously in the same manufacturing process. Typically, an additional mask layer is usually adopted to cover the e-fuse region during the processes for manufacturing the structure in the array region and/or the structure in the peripheral region, in order to form an e-fuse structure in an adequate size. That is, the processes for manufacturing the structures in the array region, the eFuse region, and the peripheral region are independent of each other. Therefore, the process complexity and production cost of the conventional manufacturing method are very high. In the method for manufacturing a memory device provided in some embodiments, the word line trench 145 and the eFuse trench 155 with different widths can be formed simultaneously. In other words, in the manufacturing processes shown in FIG. 1A to FIG. 1F, the first few processes for forming an e-fuse structure in the eFuse region 20 can be integrated with the processes for forming the structure in the array region 10. In this way, the process complexity and the production cost of the manufacturing method can be reduced.

In some embodiments, the peripheral region 30 is not affected by the manufacturing processes as described in FIG. 1A to FIG. 1F (for example, the peripheral region 30 can be covered by a mask layer). Therefore, the peripheral region 30 is not depicted in FIG. 1A to FIG. 1F for the sake of simplicity and clarity of the drawings.

On the other hand, in the manufacturing process as described in FIG. 2A, the patterned photoresist layer 116 in the array region 10 has an opening (not shown) between adjacent buried word lines 106, but the patterned photoresist layer 116 in the peripheral region 30 does not have an opening. It should be noted that the opening of the patterned photoresist layer 116 in the array region 10 is not positioned right above the buried word line 106. Therefore, the eFuse gate electrode 120 would not be formed in the word line trench 145. In the manufacturing process as described in FIG. 2B, a bit line contact trench is formed between adjacent buried word lines 106 in the array region 10. In the manufacturing process as described in FIG. 2C, the bit line contact trench in the array region 10 is filled with a conductive material to form a bit line contact structure 140, while a conductive material layer is formed on the gate oxide layer 112 in the peripheral region 30. In the manufacturing process as described in FIG. 2D, the position of the patterned photoresist layer 129 in the array region 10 corresponds to the position of the bit line contact structure 140, while the position of the patterned photoresist layer 129 in the peripheral region 30 corresponds to the position of a gate structure 150 to be formed later. Also, in the manufacturing process as described in FIG. 2E, a stack structure that includes the metal silicide layer 122, the metal layer 124 and the capping layer 126 in the array region 10 is formed on the bit line contact structure 140. In this step, the conductive material layer formed in the peripheral region 30 is patterned to form the gate structure 150. Therefore, a stack structure in the peripheral region 30 includes the gate oxide layer 112, the gate structure 150, the metal silicide layer 122, the metal layer 124 and the capping layer 126 above the substrate 102. Also, in the manufacturing process as described in FIG. 2F, there is no opening formed in the second insulating layer 130 in the array region 10. In this step, similar to the manufacturing process performed in the eFuse region 20, an opening is formed in the capping layer 126 in the peripheral region 30, and the source/drain contact holes are formed in the second insulating layer 130 in the peripheral region 30. In addition, in the manufacturing process as described in FIG. 2G, the array region 10 is not affected by the manufacturing process in FIG. 2G (performed in the eFuse region 20); for example, the array region 10 can be covered by a mask layer. Thus, as shown in FIG. 3, a structure in the array region 10 that is not affected by the process in FIG. 2G can be formed. In this step, similar to the manufacturing process performed in the e-fuse region 20, a conductive layer 132 is formed in the capping layer 126 in the peripheral region 30, the source/drain contact structures 136 are formed in the source/drain contact holes, and the metal silicide layer 134 is formed between the source/drain contact structures 136 and the source/drain structures 108. In some embodiments, the source/drain structures 108 in the peripheral region 30 can be formed in the implantation process as described in FIG. 1F. In some other embodiments, the source/drain structures 108 positioned in the peripheral region 30 can be formed by performing an additional implantation process after the manufacturing process as described in FIG. 2E.

The gate structure 150 in the peripheral region 30 can be electrically connected to an external component via the metal silicide layer 122, the metal layer 124 and the conductive layer 132. Therefore, the metal silicide layer 122, the metal layer 124 and the conductive layer 132 above the gate structure 150 in the peripheral region 30 can be collectively referred to as "a gate contact structure", in accordance with some embodiments.

According to the aforementioned method for manufacturing the memory device in some embodiments, the bit line contact structure 140 in the array region 10 and the eFuse gate electrode 120 in the eFuse region 20 can be formed simultaneously. Also, the eFuse contact structure in the eFuse region 20 and the gate contact structure in the peripheral region 30 can be formed simultaneously. Therefore, in the manufacturing processes as described in FIG. 2A to FIG. 2G, the later processes for forming the e-fuse structure in the eFuse region 20 can be integrated with the processes for forming the structure in the array region 10 and the structure in the peripheral region 30. Therefore, the production cost and the process complexity of the manufacturing method in accordance with some embodiments can be reduced.

Some embodiments of the present invention provide a memory device. Referring to FIG. 2G, FIG. 3 and FIG. 4, a memory device includes a substrate 102 having an array region 10, an eFuse region 20 and a peripheral region 30. As shown in FIG. 1F and FIG. 2G, the memory device includes an eFuse structure 100 in the eFuse region 20. The e-fuse structure 100 includes a gate oxide layer 104 disposed in the e-fuse trench 155, a dummy buried word line 106' and an insulating filling layer 110. The gate oxide layer 104 is conformally formed on the surface of the eFuse trench 155. The dummy buried word line 106' is formed on the gate oxide layer 104, and the insulating filling layer 110 is formed on the dummy buried word line 106'. The eFuse trench 155 is formed in the substrate 102. The eFuse structure 100 further includes a gate oxide layer 112, several doped regions 108 and an eFuse gate electrode 120. The gate oxide layer 112 has an opening 165A (shown in FIG. 2B). The gate oxide layer 112 is formed on the substrate 102 and connected to the gate oxide layer 104. These doped regions 108 are respectively formed in the substrate 102 on opposite sides outside the eFuse trench 155. Also, the doped regions 108 are in contact with the gate oxide layer 104. The eFuse gate electrode 120 is formed in the eFuse trench 155 and disposed on the insulating filling layer 110. Also, the eFuse gate electrode 120 is in contact with the gate oxide layer 104 and the gate oxide layer 112. The insulating filling layer 110 is configured to electrically isolate the eFuse gate electrode 120 and the dummy buried word line 106'. In this embodiment, the eFuse gate electrode 120 is also formed in the opening 165A of the gate oxide layer 112, and the top surface of the eFuse gate electrode 120 is level with the top surface of the gate oxide layer 112.

The eFuse structure 100 further includes an eFuse contact structure on the eFuse gate electrode 120 The eFuse contact structure may include the metal silicide layer 122, the metal layer 124 and the conductive layer 132 sequentially formed on the eFuse gate electrode 120. In some embodiments, the conductive layer 132 is formed in the opening of the capping layer 126. The metal silicide layer 122 and the metal layer 124 are further disposed and extended on the gate oxide layer 112.

To achieve the miniaturization of the memory device, the width of the word line trench 145 should be as narrow as possible. However, the critical dimension of the opening 165A that is formed in the patterning step must be greater than the critical dimension of the word line trench 145, in order to reduce the operating voltage of the eFuse structure. If the width of the eFuse trench 155 is equal to the width of the word line trench 145, the width of the eFuse trench 155 will be less than the width of the opening 165. In this case, the conductive material filled in the receiving space for eFuse gate electrode is likely to remain on the top surfaces of the doped regions 108, thereby causing a short circuit. As a result, the yield of the memory device will be reduced. On the other hand, if the width of the eFuse trench 155 is too small, it will be difficult to align the opening 165A with the eFuse trench 155 when the opening 165A is formed. As a result, the resistance of the eFuse gate electrode 120 will increase. The eFuse gate electrode 120 may not even be in contact with the gate oxide layer 104, which leads to the problem that the eFuse structure 100 cannot work.

Referring to FIG. 1F, in some embodiments, the ratio of the second width W2 to the first width W1 (i.e., W2/W1) is in a range of 2.0 to 5.0, which facilitates the integration of the later processes for forming the e-fuse structure in the eFuse region 20 with the processes for forming the structures in the array region 10 and the peripheral region 30. Furthermore, the aforementioned problems can be avoided or solved by the provided method in accordance with some embodiments of the present disclosure.

Referring to FIG. 2B, after the gate oxide layer 104 is formed, the opening of the eFuse trench 155 has a third width W3, and the third width W3 is greater than the fourth width W4 of the opening 165A. Therefore, the opening 165A of the gate oxide layer 112 is less than the bottom width (i.e., the third width W3) of the eFuse gate electrode 120. If the width of the protrusion of the gate oxide layer 112 is expressed as ((W3−W4)/2), the width of the protrusion is 5%-45% of the bottom width (i.e., the third width W3) of the eFuse gate electrode 120, in accordance with some embodiments of the present disclosure. That is, the ratio of the fourth width W4 to the third width W3 is in a range of 0.1 to 0.9. In this way, it is advantageous to control the breakdown position occurring in the gate oxide layer 104 when the operation of writing is performed on the eFuse structure 100 of the memory device.

Referring to FIG. 2G, in this embodiment, the width (i.e., the fifth width W5) of the gate oxide layer 112 is greater than the thickness T1 of the gate oxide layer 104. Thus, when the operation of writing is performed on the eFuse structure 100, the dielectric breakdown is more likely to occur in the thinner gate oxide layer 104 than in the thicker gate oxide layer 112.

In addition, as shown in FIG. 2C, an eFuse gate electrode 120 is disposed above the dummy buried word line 106' and the insulating filling layer 110, in accordance with some embodiments of the present disclosure. Therefore, the position where the dielectric breakdown occurs can be restricted in gate oxide layer 104 between the eFuse gate electrode 120 and the source/drain structures 108. In this embodiment, the resistance value read from the eFuse structure can be reduced, and a narrower distribution of resistance values can be obtained. As a result, the yield and reliability of the memory device can be improved.

Referring to FIG. 2B and FIG. 2C, the portion of the eFuse gate electrode 120 that contacts the first gate oxide layer 104 has the first thickness D1. The doped region has a depth D2 greater than the first thickness D1. In some embodiments, the ratio of the depth D2 to the first thickness D1 (i.e., D2/D1) is in a range of 1.5 to 5.0, which can control the position of the dielectric breakdown and improve the resistance distribution of the eFuse structure.

According to the aforementioned descriptions, the memory device in accordance with some embodiments provides an eFuse gate electrode above the dummy buried word line and the insulating filling layer, and the position where the dielectric breakdown occurs in the gate oxide layer can be controlled within a certain range. Therefore, the resistance values and its distribution of the eFuse structure can be improved. Accordingly, the performance and the yield of the memory device can be improved. In addition, according to the method for manufacturing the memory device in some embodiments, the first few processes for forming the e-fuse structure in the eFuse region can be integrated with the processes for forming the structure in the array region. Also, the later processes for forming the e-fuse structure in the eFuse region can be integrated with the processes for forming the structures in the array region and the peripheral region. Therefore, the production cost and the process complexity of the manufacturing method that is provided in some embodiments of the present disclosure can be reduced.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device, comprising:
a substrate having an array region and an electronic fuse (eFuse) region, wherein the eFuse region of the substrate has an eFuse trench; and
an eFuse structure, comprising:
a first gate oxide layer conformally formed on a surface of the eFuse trench;
a plurality of doped regions, respectively formed in the substrate on opposite sides outside the eFuse trench, wherein the plurality of doped regions are in contact with the first gate oxide layer;
a dummy buried word line formed on the first gate oxide layer; and
an eFuse gate electrode formed on the dummy buried word line and in contact with the first gate oxide layer, wherein the dummy buried word line is electrically isolated from the eFuse gate electrode.

2. The memory device as claimed in claim 1, wherein the eFuse structure further comprises an insulating filling layer disposed between the dummy buried word line and the eFuse gate electrode, a portion of the eFuse gate electrode that contacts the first gate oxide layer has a first thickness D1, and each of the plurality of doped regions has a depth D2 greater than the first thickness D1.

3. The memory device as claimed in claim 2, wherein a ratio of the depth D2 to the first thickness D1 (D2/D1) is in a range of 1.5 to 5.0.

4. The memory device as claimed in claim 1, wherein the array region of the substrate has a word line trench, and the memory device further comprises:
a buried word line formed in the word line trench, wherein a top surface of the buried word line is higher than a top surface of the dummy buried word line, and
wherein the word line trench has a first width W1, the eFuse trench has a second width W2, and a ratio of the second width W2 to the first width W1 (W2/W1) is in a range of 2.0 to 5.0.

5. The memory device as claimed in claim 1 further comprising a second gate oxide layer over the substrate, wherein the second gate oxide layer has an opening that exposes the eFuse gate electrode, and a width of the opening is less than a bottom width of the eFuse gate electrode.

6. The memory device as claimed in claim 5, wherein a ratio of the width of the opening to the bottom width of the eFuse gate electrode is in a range of 0.1 to 0.9.

7. The memory device as claimed in claim 5, wherein a top surface of the eFuse gate electrode is lower than or level with a top surface of the second gate oxide layer.

8. The memory device as claimed in claim 7, wherein the top surface of the eFuse gate electrode is higher than or level with a top surface of each of the plurality of doped regions.

9. The memory device as claimed in claim 1, further comprising:
an eFuse contact structure electrically connecting the eFuse gate electrode, wherein the eFuse contact structure comprises:
a metal silicide layer on the eFuse gate electrode;
a metal layer on the metal silicide layer; and
a conductive layer on the metal layer,
wherein a width of the conductive layer is less than or equal to a width of the metal layer.

10. A method for manufacturing a memory device, comprising:
providing a substrate, wherein the substrate has an array region and an eFuse region;
forming an eFuse structure in the eFuse region of the substrate, wherein forming the eFuse structure comprises:
forming an eFuse trench in the eFuse region of the substrate;
forming a first gate oxide layer on a surface of the eFuse trench;
forming a dummy buried word line on the first gate oxide layer;
forming a plurality of doped regions respectively in the substrate on opposite sides outside the eFuse trench, wherein the plurality of doped regions are in contact with the first gate oxide layer; and
forming an eFuse gate electrode on the dummy buried word line and in contact with the first gate oxide layer, wherein the dummy buried word line is electrically isolated from the eFuse gate electrode.

11. The method for manufacturing the memory device as claimed in claim 10, wherein forming the eFuse structure further comprises:
forming an insulating filling layer on the dummy buried word line after the dummy buried word line is formed, thereby electrically isolating the dummy buried word line from the eFuse gate electrode,
wherein a portion of the eFuse gate electrode that contacts the first gate oxide layer has a first thickness D1, and each of the plurality of doped regions has a depth D2 greater than the first thickness D1.

12. The method for manufacturing the memory device as claimed in claim 11, further comprising:
forming a second gate oxide layer on the substrate and the insulating filling layer after the insulating filling layer is formed and before the eFuse gate electrode is formed,
patterning the second gate oxide layer to form an opening in the second gate oxide layer;
partially removing the insulating filling layer to form a receiving space in the eFuse trench, wherein the receiving space is in communication with the opening of the second gate oxide layer, and a removed portion of the insulating filling layer has the first thickness,
wherein forming the eFuse gate electrode on the dummy buried word line comprises forming the eFuse gate electrode in the receiving space, and
wherein the opening exposes the eFuse gate electrode, and a width of the opening is less than a bottom width of the eFuse gate electrode.

13. The method for manufacturing the memory device as claimed in claim 10, further comprising:
forming a metal silicide layer on the eFuse gate electrode;
forming a metal layer on the metal silicide layer;
forming a capping layer on the metal layer;
patterning the metal silicide layer, the metal layer and the capping layer;
forming an insulating layer on the substrate, and making the insulating layer and the capping layer coplanar;
performing an etching process to form an opening in the capping layer, wherein the opening exposes the metal layer; and forming a conductive layer in the opening, wherein a width of the conductive layer is less than or equal to a width of the metal layer, wherein the metal silicide layer, the metal layer and the conductive layer form an eFuse contact structure.

14. The method for manufacturing the memory device as claimed in claim 10, further comprising:

forming a word line trench in the array region of the substrate, wherein the word line trench and the eFuse trench are formed simultaneously; and forming a buried word line in the word line trench, wherein the buried word line and the dummy buried word line are formed simultaneously.

15. The method for manufacturing the memory device as claimed in claim 14, wherein the word line trench has a first width W1, the eFuse trench has a second width W2, and a ratio of the second width W2 to the first width W1 (W2/W1) is in a range of 2.0 to 5.0.

16. The method for manufacturing the memory device as claimed in claim 13, further comprising:

forming a gate structure in a peripheral region of the substrate; and forming a gate contact structure on the gate structure, wherein the gate contact structure and the eFuse contact structure are formed simultaneously.

* * * * *